(12) United States Patent
Itokawa et al.

(10) Patent No.: US 7,042,037 B1
(45) Date of Patent: May 9, 2006

(54) SEMICONDUCTOR DEVICE

(75) Inventors: Hiroshi Itokawa, Yokohama (JP); Koji Yamakawa, Tokyo (JP); Tohru Ozaki, Tokyo (JP); Yoshinori Kumura, Yokohama (JP); Takamichi Tsuchiya, Yokohama (JP); Nicolas Nagel, Dresden (DE); Bum-Ki Moon, Poughkeepsie, NY (US); Andreas Hilliger, Taipei-shi (TW)

(73) Assignees: Kabushiki Kaisha Toshiba, Tokyo (JP); Infineon Technologies AG, Munich (DE)

( * ) Notice: Subject to any disclaimer, the term of this patent is extended or adjusted under 35 U.S.C. 154(b) by 0 days.

(21) Appl. No.: 10/986,060

(22) Filed: Nov. 12, 2004

(51) Int. Cl.
*H01L 31/062* (2006.01)

(52) U.S. Cl. .................. 257/295; 257/E27.104

(58) Field of Classification Search .................. None
See application file for complete search history.

(56) References Cited

U.S. PATENT DOCUMENTS 6,351,006 B1  2/2002  Yamakawa et al.
6,500,678 B1  12/2002  Aggarwal et al.
6,599,806 B1 * 7/2003  Lee .......................... 438/396
2004/0051129 A1 * 3/2004  Paz de Araujo et al. ..... 257/296

FOREIGN PATENT DOCUMENTS

JP  10-173138     6/1998
JP  2000-208725   7/2000
JP  2000-260954   9/2000

* cited by examiner

*Primary Examiner*—Tu-Tu Ho
(74) *Attorney, Agent, or Firm*—Finnegan, Henderson, Farabow, Garrett & Dunner, L.L.P.

(57) ABSTRACT

Disclosed is a semiconductor device comprising a semiconductor substrate, a capacitor provided above the semiconductor substrate and including a bottom electrode, a top electrode, and a dielectric film provided between the bottom electrode and the top electrode, the bottom electrode comprising a first conductive film containing iridium, a second conductive film provided between the dielectric film and the first conductive film and formed of a noble metal film, a third conductive film provided between the dielectric film and the second conductive film and formed of a metal oxide film having a perovskite structure, and a diffusion prevention film provided between the first conductive film and the second conductive film and including at least one of a metal film and a metal oxide film, the diffusion prevention film preventing diffusion of iridium contained in the first conductive film.

11 Claims, 3 Drawing Sheets

SEMICONDUCTOR DEVICE

BACKGROUND OF THE INVENTION

1. Field of the Invention

The present invention relates to a semiconductor device having a capacitor.

2. Description of the Related Art

In recent years, many efforts have been made to develop ferroelectric memories using a ferroelectric film as a dielectric film of a capacitor, that is, FeRAMs (Ferroelectric Random Access Memories).

A typical ferroelectric film used for a ferroelectric memory is a $Pb(Zr_xTi_{1-x})O_3$ film (PZT film) or an $SrBi_2Ta_2O_9$ film (SBT film). The PZT is a perovskite compound, and the SBT is a Bi aurivillius phase compound having a quasi-perovskite structure.

If for example, a PZT film is used as a ferroelectric film, electrodes are composed of conductive perovskite type metal oxide films such as $SrRuO_3$ films (SRO films) or the like in order to, for example, improve their fatigue characteristic. For example, Jpn. Pat. Appln. KOKAI Publication No. 2000-208725 and Jpn. Pat. Appln. KOKAI Publication No. 2000-260954 describe ferroelectric capacitors having electrodes each made of a stacked film composed of an SRO film and a Pt film.

Further, what is called a COP (Capacitor On Plug) structure has been proposed in which a capacitor is formed on a plug in order to increase the degree of integration of the ferroelectric memory. In the COP structure, to prevent the plug from being oxidized by thermal treatment, a bottom electrode of the capacitor is partly composed of an Ir film or Ir oxide film, which has an excellent oxygen barrier characteristic.

However, with this structure, Ir disadvantageously diffuses through the conductive perovskite type metal oxide film or a capacitor dielectric film, which degrades the characteristics or reliability of the capacitor. For example, Ir may react with Pb in the PZT film to form a conductive oxide, which increases a leak current of the capacitor or Ir may react with Sr in the SRO film to degrade the crystallinity of the SRO film, which degrades the characteristics or reliability of a dielectric film on the SRO film.

Thus, a problem with the conventional capacitor is that the diffusion of Ir may degrade the characteristics or reliability of the capacitor.

BRIEF SUMMARY OF THE INVENTION

According to an aspect of the present invention, there is provided a semiconductor device comprising a semiconductor substrate; a capacitor provided above the semiconductor substrate and including a bottom electrode, a top electrode, and a dielectric film provided between the bottom electrode and the top electrode, the bottom electrode comprising a first conductive film containing iridium, a second conductive film provided between the dielectric film and the first conductive film and formed of a noble metal film, a third conductive film provided between the dielectric film and the second conductive film and formed of a metal oxide film having a perovskite structure, and a diffusion prevention film provided between the first conductive film and the second conductive film and including at least one of a metal film and a metal oxide film, the diffusion prevention film preventing diffusion of iridium contained in the first conductive film.

DETAILED DESCRIPTION OF THE INVENTION

Embodiments of the present invention will be described below with reference to the drawings.

Embodiment 1

Figure 1:
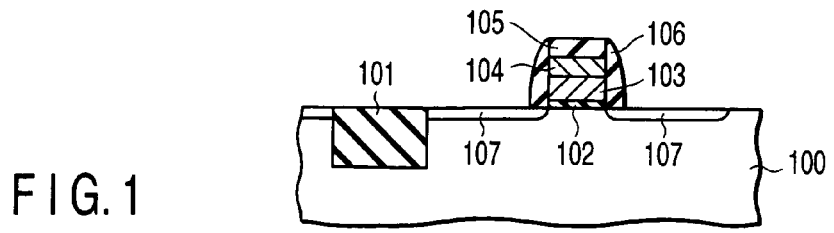
FIGS. 1 to 3 are sectional views schematically showing a method of manufacturing a semiconductor device according to a first embodiment of the present invention.
Figure 2:
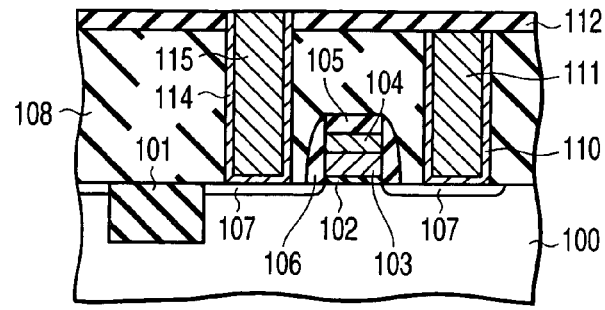
Figure 3:
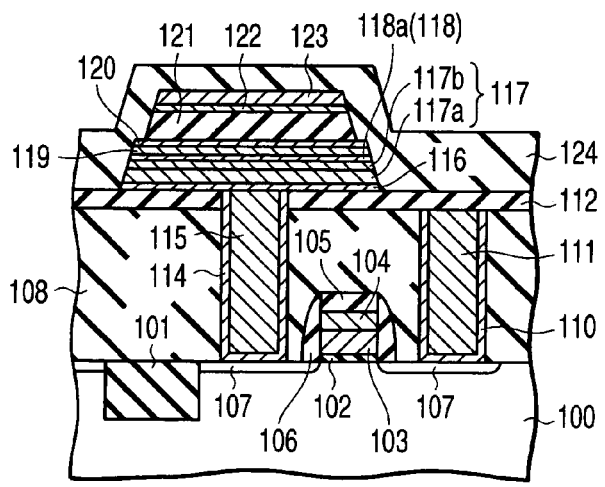

FIGS. 1 to 3 are sectional views schematically showing a method of manufacturing a semiconductor device according to a first embodiment of the present invention.

First, as shown in FIG. 1, an isolation region 101 of an STI (Shallow Trench Isolation) structure is formed on a p-type silicon substrate (semiconductor substrate) 100. Subsequently, an MIS transistor is formed as described below.

First, as a gate insulating film 102, a silicon oxide film of thickness about 6 nm is formed by thermal oxidization. Subsequently, arsenic-doped n⁺ type polysilicon film 103 is formed on the gate insulating film 102. Moreover, a $WSi_x$ film 104 and a silicon nitride film 105 are formed on the polysilicon film 103. Subsequently, the polysilicon film 103, the $WSi_x$ film 104, and the silicon nitride film 105 are processed by a normal photo lithography process and a normal RIE process to form a gate electrode. Subsequently, a silicon nitride film 106 is deposited all over the surface of the resulting structure. Moreover, RIE is carried out to form side wall spacers formed of the silicon nitride film 106, on side walls of the gate electrode. Although not described in detail, in the present step, source/drain regions 107 are formed by ion implantation and thermal treatment.

Then, as shown in FIG. 2, a CVD (Chemical Vapor Deposition) process is used to deposit a silicon oxide film 108 all over the surface of the resulting structure. Further, a CMP process is used to execute a flattening process. Subsequently, a contact hole is formed through the silicon oxide film 108 so as to reach one of the source/drain regions 107. Then, a sputtering process or the CVD process is used to deposit a titanium film. Subsequently, the titanium film is nitrided by thermal treatment in a foaming gas to form a TiN film 110. Moreover, the CVD process is used to deposit a tungsten film 111. Subsequently, the CMP process is used to remove the TiN film 110 and tungsten film 111 from outside the contact hole, while leaving the TiN film 110 and the tungsten film 111 in the contact hole. This forms a plug connected to one of the source/drain regions 107. Then, the CVD process is used to deposit a silicon nitride film 112 all over the surface of the resulting structure. Furthermore, a control hole is formed so as to reach the other source/drain region 107. Subsequently, a method similar to that described above is used to form a TiN film 114 and a tungsten film 115 in the contact hole. This forms a plug connected to the other source/drain region 107.

Then, as shown in FIG. 3, a titanium (Ti) film 116 of thickness about 10 nm is deposited by the sputtering process. Subsequently, as a first conductive film 117, an iridium (Ir) film 117a of about 100 nm thickness and an iridium oxide ($IrO_2$) film 117b of about 50 nm thickness are sequentially deposited by the sputtering process. The iridium film 117a and the iridium oxide film 117b have an excellent oxygen barrier characteristic and can thus prevent the oxidization of the plug 115 during the subsequent thermal treatment step. Subsequently, as a diffusion prevention film 118, a titanium (Ti) film 118a of thickness about 2.5 nm is deposited by the sputtering process. The titanium film 118a prevents the upward diffusion of the iridium contained in the iridium film 117a and iridium oxide film 117b. Subsequently, as a second conductive film, a platinum (Pt) film 119 of thickness about 50 nm is deposited by the sputtering process. Moreover, as a third conductive film, an $SrRuO_3$ film (SRO film) 120 of thickness about 10 nm is deposited by the sputtering process. Subsequently, the SRO film 120 is crystallized by RTA (Rapid Thermal Annealing) in an oxygen atmosphere. The SRO film 120 with an excellent crystallinity can be easily formed by depositing the film at a temperature of, for example, 500° C.

Then, as a dielectric film (ferroelectric film) of the capacitor, a $Pb(Zr_xTi_{1-x})O_3$ film (PZT film) 121 having a thickness of about 130 nm is formed by the sputtering process. Moreover, the PZT film 121 is crystallized by RTA in an oxygen atmosphere.

Then, an SRO film 122 having a thickness of about 10 nm is deposited by the sputtering process. Moreover, the SRO film 122 is crystallized by RTA in an oxygen atmosphere. The SRO film 122 with an excellent crystallinity can be easily formed by depositing the film at a temperature of, for example, 500° C. Furthermore, a platinum film 123 of thickness about 50 nm is deposited by the sputtering process.

Then, the CVD process is used to deposit a silicon oxide film (not shown) all over the surface of the resulting structure. Moreover, the photo lithography process and the RIE process are used to pattern the silicon oxide film. Subsequently, the patterned silicon oxide film is used as a mask to etch the platinum film 123, the SRO film 122, and the PZT film 121 by the RIE process. Furthermore, the photo lithography process and the RIE process are used to pattern the SRO film 120, the platinum film 119, the titanium film 118a, the iridium oxide film 117b, the iridium film 117a, and the titanium film 116.

In this manner, a ferroelectric capacitor is formed which comprises a bottom electrode having the titanium film 116, the iridium 117a, the iridium oxide film 117b, the titanium film 118a, the platinum film 119, and the SRO film 120, a dielectric film formed of the PZT film 121, and a top electrode having the SRO film 122 and the platinum film 123.

Then, the CVD process is used to deposit a silicon oxide film 124 all over the surface of the ferroelectric capacitor. Subsequently, to recover from damage done to the PZT film 121 during etching, the capacitor is thermally treated at a temperature of about 650° C. in an oxygen atmosphere. During the thermal treatment, the tungsten plug 115 is prevented from being oxidized because the surface of the tungsten plug 115 is covered with the iridium film 117a and iridium oxide film 117b, which have an excellent oxygen barrier characteristic. Further, since the titanium film 118a is formed on the iridium oxide film 117b, it blocks the diffusion of the iridium contained in the iridium film 117a and iridium oxide film 117b. It is thus possible to prevent the iridium from diffusing to the SRO film 120 and the PZT film 121 through the platinum film 119.

The subsequent steps are not shown. A ferroelectric memory having a COP (Capacitor On Plug) structure is completed by subsequently forming a contact connected to the tungsten film 111, drive lines and bit lines, metal interconnects, and the like.

Figure 4:
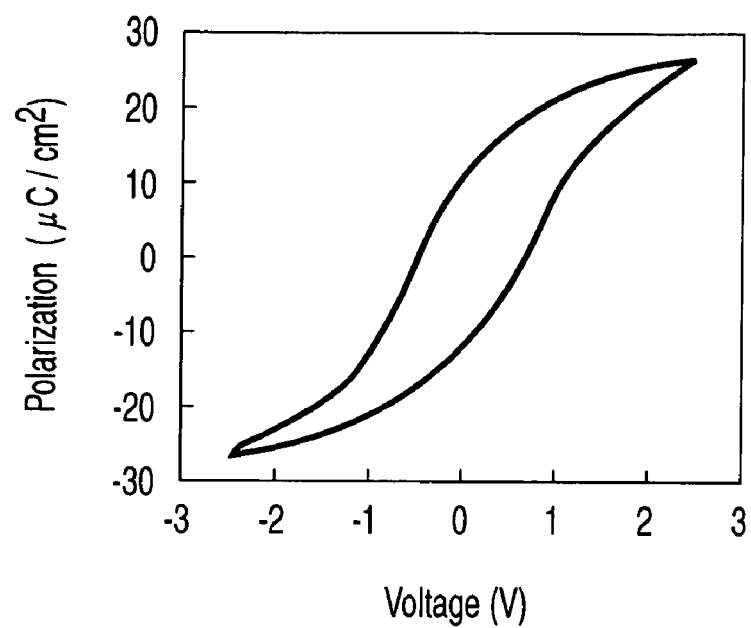
FIG. 4 is a graph showing a hysteresis characteristic of a capacitor according to the first embodiment of the present invention.
Figure 5:
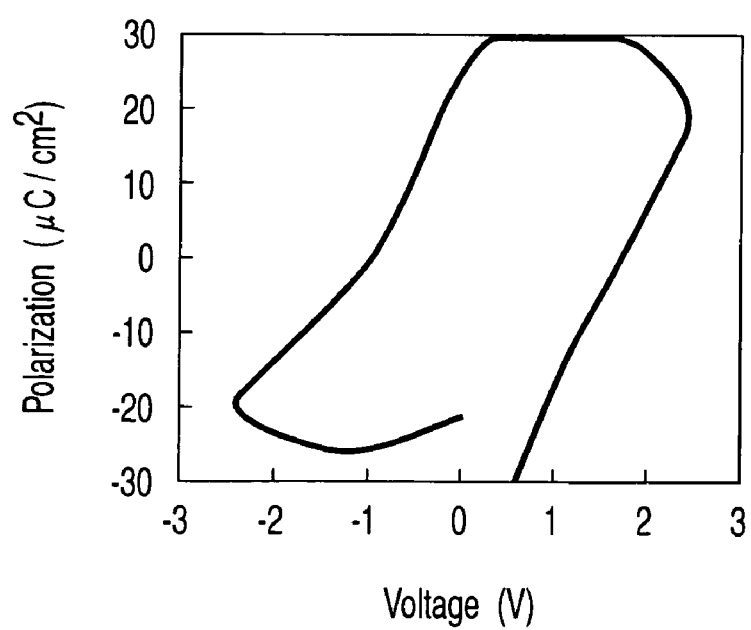
FIG. 5 is a graph showing a hysteresis characteristic of a capacitor according to a comparative example of the first embodiment of the present invention.

FIG. 4 is a graph showing the hysteresis characteristic of a capacitor formed using a process similar to the above described process. The axis of abscissa indicates a voltage applied to the capacitor, while the axis of ordinate indicates the polarization of the capacitor. FIG. 5 is a graph showing the hysteresis characteristic of a capacitor according to a comparative example. The capacitor according to the comparative example is not provided with any diffusion prevention film (corresponding to the titanium film 118a, shown in FIG. 3).

Comparison of FIG. 4 (present embodiment) with FIG. 5 (comparative example) clearly indicates that the capacitor according to the present embodiment has a markedly improved hysteresis characteristic compared to the capacitor of the comparative example.

Figure 6:
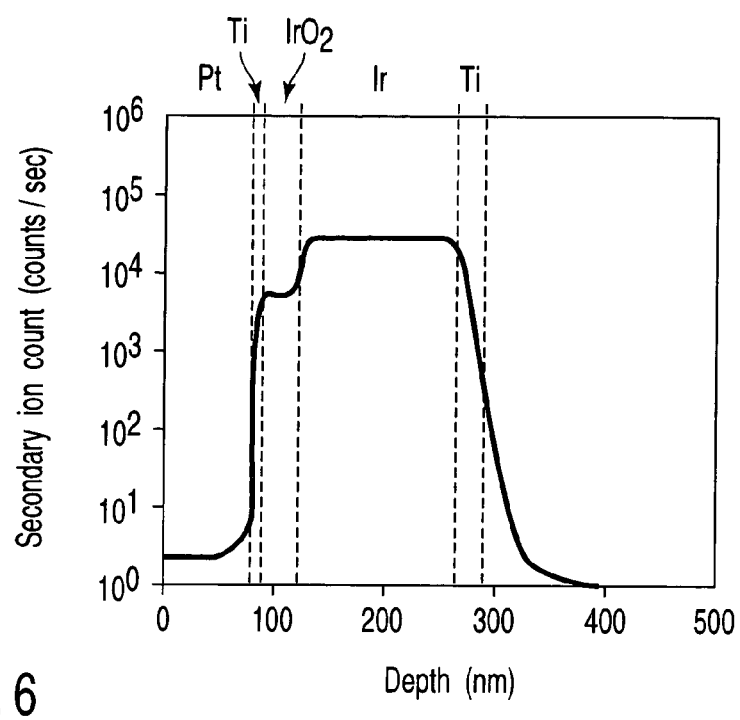
FIG. 6 is a graph showing the diffusion of iridium according to the first embodiment of the present invention.
Figure 7:
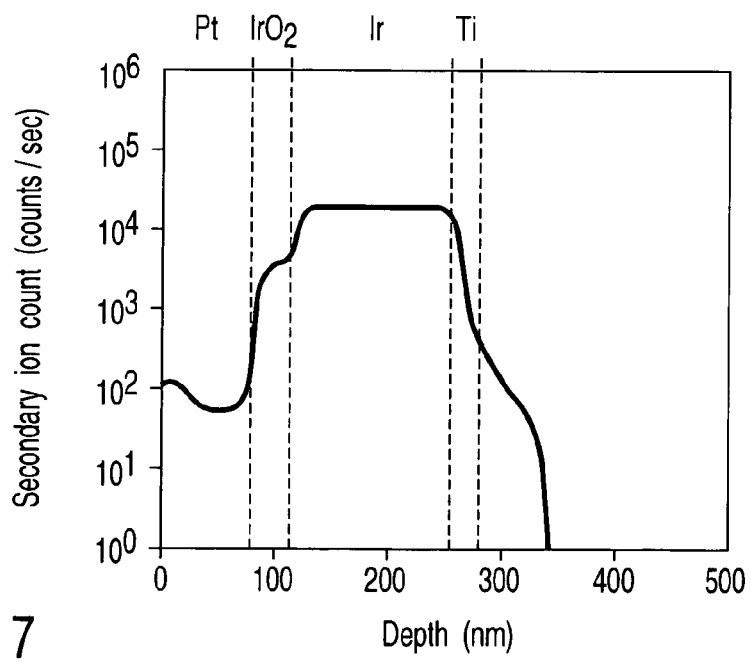
FIG. 7 is a graph showing the diffusion of iridium according to a comparative example of the first embodiment of the present invention.

FIG. 6 is a graph showing the results of SIMS analysis of the sample according to the present embodiment. FIG. 7 is a graph showing the results of SIMS analysis of the sample according to a comparative example of the present embodiment. The axis of abscissa indicates depth, while the axis of ordinate indicates a secondary ion count. For the sample according to the present embodiment, the following films were sequentially formed on a silicon oxide film on a silicon substrate: a titanium film of thickness about 10 nm, an iridium film of thickness about 100 nm, an iridium oxide film of thickness about 50 nm, a titanium film of thickness about 2.5 nm, and a platinum film of thickness about 100 nm. The resulting structure was then thermally treated at a temperature of about 650° C. in an oxygen atmosphere for 60 minutes. For the sample according to the comparative example, the following films were sequentially formed on a silicon oxide film on a silicon substrate: a titanium film of thickness about 10 nm, an iridium film of thickness about 100 nm, an iridium oxide film of thickness about 50 nm, and a platinum film of thickness about 100 nm. The resulting structure was then thermally treated at a temperature of about 650° C. in an oxygen atmosphere for 60 minutes.

Comparison of FIG. 6 (present embodiment) with FIG. 7 (comparative example) clearly indicates that the sample according to the present embodiment significantly suppresses the diffusion of iridium into the platinum film. This is considered to result in a favorable hysteresis characteristic such as the one shown in FIG. 4.

As described above, according to the present embodiment, the titanium film 118a (diffusion prevention film), which acts as an effective barrier for the diffusion of the iridium, is provided between the platinum film 119 (second conductive film) and the stacked film (first conductive film) made of the iridium film 117a and the iridium oxide film 117b. This makes it possible to prevent the iridium from diffusing to the SRO film 120 (third conductive film) and PZT film 121 (dielectric film) through the platinum film 119. It is in turn possible to suppress the reaction of the iridium with elements contained in the SRO film or the reaction of the iridium with elements contained in the PZT film. Consequently, the degradation of the SRO and PZT films can be prevented. It is therefore possible to obtain a favorable SRO and PZT films and thus a reliable capacitor with very excellent characteristics.

In general, the iridium oxide film does not exhibit the (111) orientation. Accordingly, if the platinum film is formed directly on the iridium oxide film, it also does not exhibit a favorable (111) orientation. It is thus not easy to obtain an SRO film or PZT film having a favorable (111) orientation. In the present embodiment, the titanium film is formed between the iridium oxide film and the platinum film. This allows the platinum film to be easily (111) oriented, thus making it possible to obtain an SRO and PZT films having a favorable (111) orientation. It is therefore possible to obtain a favorable SRO and PZT films and thus a reliable capacitor with excellent characteristics.

Embodiment 2

Figure 8:
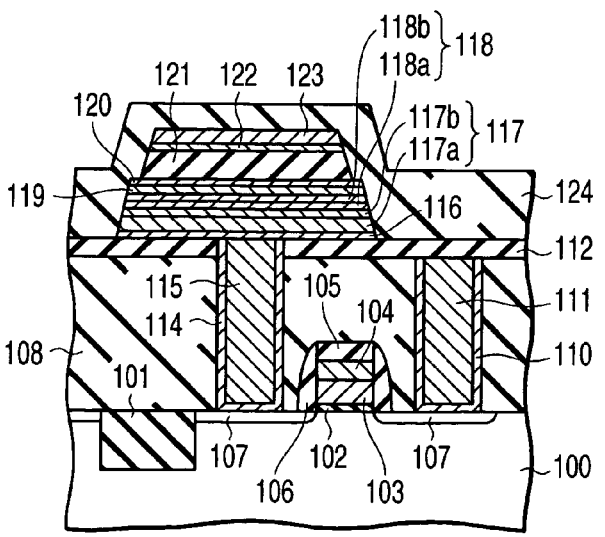
FIG. 8 is a sectional view schematically showing a part of a method of manufacturing a semiconductor device according to a second embodiment of the present invention.

FIG. 8 is a sectional view schematically showing a method of manufacturing a semiconductor device according to a second embodiment of the present invention. The steps executed before the steps of forming a capacitor are similar to those shown in FIGS. 1 and 2 for the first embodiment.

After the step shown in FIG. 2 for the first embodiment, the titanium film 116 of thickness about 10 nm is deposited by the sputtering process as shown in FIG. 8. Subsequently, as the first conductive film 117, the iridium (Ir) film 117a of about 100 nm thickness, and the iridium oxide ($IrO_2$) film 117b of about 50 nm thickness are sequentially deposited by the sputtering process. Subsequently, as a diffusion prevention film, the titanium (Ti) film 118a of thick ness about 2.5 nm and the $SrRuO_3$ film (SRO film) 118b of thickness about 10 nm are sequentially deposited by the sputtering process. The titanium film 118a and the SRO film 118b prevent the upward diffusion of the iridium contained in the iridium film 117a and iridium oxide film 117b. Then, the SRO film 118b is crystallized by RTA in an oxygen atmosphere. Subsequently, as a second conductive film, the platinum (Pt) film 119 of thickness about 50 nm is deposited by the sputtering process. Moreover, as a third conductive film, an SRO film 120 of thickness about 10 nm is deposited by the sputtering process. Subsequently, the SRO film 120 is crystallized by RTA in an oxygen atmosphere. The SRO film 120 with an excellent crystallinity can be easily formed by depositing the film at a temperature of, for example, 500° C.

Then, as a dielectric film (ferroelectric film) of the capacitor, a $Pb(Zr_xTi_{1-x})O_3$ film (PZT film) 121 having a thickness of about 130 nm is formed by the sputtering process. Moreover, the PZT film 121 is crystallized by RTA in an oxygen atmosphere.

Then, an SRO film 122 having a thickness of about 10 nm is deposited by the sputtering process. Moreover, the SRO film 122 is crystallized by RTA in an oxygen atmosphere. The SRO film 122 with an excellent crystallinity can be easily formed by depositing the film at a temperature of, for example, 500° C. Furthermore, a platinum film 123 of thickness about 50 nm is deposited by the sputtering process.

Then, the CVD process is used to deposit a silicon oxide film (not shown) all over the surface of the resulting structure. Moreover, the photo lithography process and the RIE process are used to pattern the silicon oxide film. Subsequently, the patterned silicon oxide film is used as a mask to etch the platinum film 123, the SRO film 122, and the PZT film 121 by the RIE process. Furthermore, the photo lithography process and the RIE process are used to pattern the SRO film 120, the platinum film 119, the SRO film 118b, the titanium film 118a, the iridium oxide film 117b, the iridium film 117a, and the titanium film 116.

In this manner, a ferroelectric capacitor is formed which comprises a bottom electrode having the titanium film 116, the iridium film 117a, the iridium oxide film 117b, the titanium film 118a, the SRO film 118b, the platinum film 119, and the SRO film 120, the dielectric film formed of the PZT film 121, and a top electrode having the SRO film 122 and the platinum film 123.

Then, the CVD process is used to deposit a silicon oxide film 124 all over the surface of the ferroelectric capacitor. Subsequently, to recover from damage done to the PZT film 121 during etching, the capacitor is thermally treated at a temperature of about 650° C. in an oxygen atmosphere. During the thermal treatment, the tungsten plug 115 is prevented from being oxidized because the surface of the tungsten plug 115 is covered with the iridium film 117a and iridium oxide film 117b, which have an excellent oxygen barrier characteristic. Further, since the stacked film of the titanium film 118a and SRO film 118b is formed on the iridium oxide film 117b, the titanium film 118a and the SRO film 118b suppress the diffusion of the iridium contained in the iridium film 117a and iridium oxide film 117b. It is thus possible to prevent the iridium from diffusing to the SRO film 120 and the PZT film 121 through the platinum film 119. The effect of the SRO film 118b in suppressing the diffusion of iridium is mainly based on the reaction of iridium with the SRO film 118b. Specifically, upon reacting with the SRO film 118b, the iridium is consumed and thus prevented from diffusing upward. The reaction with the iridium may degrade the crystallinity of the SRO film 118b. However, the SRO film 118b does not contact with the PZT film 121. Consequently, the degraded crystallinity of the SRO film 118b does not substantially affect the PZT film 121 or the like.

The subsequent steps are not shown. A ferroelectric memory having the COP structure is completed by subsequently forming a contact connected to the tungsten film 111, drive lines and bit lines, metal interconnects, and the like.

As described above, according to the present embodiment, the stacked film (diffusion prevention film) of the titanium film 118a and SRO film 118b is provided between the platinum film 119 (second conductive film) and the stacked film (first conductive film) made of the iridium film 117a and the iridium oxide film 117b. Thus, as in the case of the first embodiment, it is possible to obtain a favorable SRO and PZT films and thus a reliable capacitor with excellent characteristics.

Various changes may be made to the above first and second embodiments as described below.

The diffusion prevention film that prevents the diffusion of the iridium may be a metal film containing at least one of Ti, V, W, Zr, Co, Mg, Hf, Mo, Mn, Ta, Nb, Pb, and Al. Alternatively, it may be a metal oxide film containing at least one of Ti, V, W, Zr, Co, Mg, Hf, Mo, Mn, Ta, Nb, Pb, Al, and Ru. Alternatively, it may be a stacked film of the above metal film and metal oxide film. The metal oxide film may typically be a $TiO_2$ film, a $ZrO_2$ film, a $CoO_2$ film, $PbO_2$ film, $Al_2O_3$ film, an SRO film, an $Sr(Ru, Ti)O_3$ film, or the like. The stacked film of the metal film and metal oxide film may typically be a Ti/SRO film, a Ti/Sr(Ru, Ti)$O_3$ film, a Co/SRO film, a Co/Sr(Ru, Ti)$O_3$ film, or the like.

The first conductive film may be a single film of iridium (Ir), a single film of iridium oxide ($IrO_2$), or a stacked film of the iridium film and iridium oxide film.

The second conductive film may be a noble metal film including at least one of a platinum film and a ruthenium film.

The third conductive film may be a conductive metal oxide film having a perovskite crystal structure (general formula: $ABO_3$) and containing at least one of Ru, Co, and Ni. Typically, the third conductive film may be an $SrRuO_3$ film, a $(La, Sr)CoO_3$ film, a $BaRuO_3$ film, an $LaNiO_3$ film, or the like.

The dielectric film may be a compound film having a perovskite structure or a Bi aurivillius phase structure. It may typically be a $Pb(Zr_xTi_{1-x})O_3$ film (PZT film), an $SrBi_2Ta_2O_9$ film (SBT film), or the like.

The plug may be a tungsten plug or a polysilicon plug.

The diffusion prevention film, the first conductive film, the second conductive film, the third conductive film, and the dielectric film may be formed using the sputtering process, the CVD process, or a sol-gel process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a capacitor provided above the semiconductor substrate and including a bottom electrode, a top electrode, and a dielectric film provided between the bottom electrode and the top electrode,
   the bottom electrode comprising a first conductive film containing iridium, a second conductive film provided between the dielectric film and the first conductive film and formed of a noble metal film, a third conductive film provided between the dielectric film and the second conductive film and formed of a metal oxide film having a perovskite structure, and a diffusion prevention film provided between the first conductive film and the second conductive film and including at least one of a metal film and a metal oxide film, the diffusion prevention film preventing diffusion of iridium contained in the first conductive film.

2. The semiconductor device according to claim 1, wherein the metal film included in the diffusion prevention film contains at least one of Ti, V, W, Zr, Co, Mg, Hf, Mo, Mn, Ta, Nb, Pb, and Al.

3. The semiconductor device according to claim 1, wherein the metal oxide film included in the diffusion prevention film contains at least one of Ti, V, W, Zr, Co, Mg, Hf, Mo, Mn, Ta, Nb, Pb, Al, and Ru.

4. The semiconductor device according to claim 1, wherein the first conductive film includes at least one of an iridium film and an iridium oxide film.

5. The semiconductor device according to claim 1, wherein the second conductive film includes at least one of a platinum film and a ruthenium film.

6. The semiconductor device according to claim 1, wherein the metal oxide film included in the third conductive film contains at least one of Ru, Co, and Ni.

7. The semiconductor device according to claim 1, wherein the metal oxide film included in the third conductive film is selected from an $SrRuO_3$ film, an $(La, Sr)CoO_3$ film, a $BaRuO_3$ film, and an $LaNiO_3$ film.

8. The semiconductor device according to claim 1, wherein the dielectric film includes a ferroelectric film.

9. The semiconductor device according to claim 8, wherein the ferroelectric film is selected from a compound film having a perovskite structure and a compound film having a Bi aurivillius phase structure.

10. The semiconductor device according to claim 1, further comprising a plug which is connected to the bottom electrode and on which the capacitor is formed.

11. The semiconductor device according to claim 10, further comprising a transistor provided on the semiconductor substrate and electrically connected to the plug.

* * * * *